United States Patent
Koyanagi et al.

(10) Patent No.: US 7,303,973 B2
(45) Date of Patent: Dec. 4, 2007

(54) ALD PROCESS FOR CAPACITOR DIELECTRIC

(75) Inventors: Kenichi Koyanagi, Tokyo (JP); Hiroshi Sakuma, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/630,444

(22) Filed: Jul. 29, 2003

(65) Prior Publication Data

US 2004/0087178 A1 May 6, 2004

(30) Foreign Application Priority Data

Jul. 29, 2002 (JP) .............................. 2002-220468

(51) Int. Cl.
*H01L 21/20* (2006.01)
(52) U.S. Cl. .................. 438/386; 438/452; 257/E21.35
(58) Field of Classification Search ................ 438/240, 438/368, 391, 452, 454
See application file for complete search history.

(56) References Cited

U.S. PATENT DOCUMENTS

| | | | | |
|---|---|---|---|---|
| 6,461,914 B1 * | 10/2002 | Roberts et al. | ............. | 438/253 |
| 6,576,053 B1 * | 6/2003 | Kim et al. | ..................... | 117/89 |
| 6,583,021 B2 * | 6/2003 | Song | ............................ | 438/396 |
| 6,753,618 B2 * | 6/2004 | Basceri et al. | .............. | 257/296 |
| 6,780,704 B1 * | 8/2004 | Raaijmakers et al. | ....... | 438/239 |
| 2002/0086476 A1 | 7/2002 | Kim et al. | | |

FOREIGN PATENT DOCUMENTS

| | | |
|---|---|---|
| JP | 9-77593 | 3/1997 |
| JP | 9-121035 | 5/1997 |
| JP | 2000-340559 | * 12/2000 |
| JP | 2001-127258 A | 5/2001 |
| JP | 2001-160616 | 6/2001 |
| JP | 2001-220676 | 8/2001 |
| JP | 2001-313379 | 11/2001 |
| JP | 2002-26273 | 1/2002 |
| KR | 2002-0061880 | 7/2002 |

OTHER PUBLICATIONS

Notification of Reasons for Refusal dated Jun. 17, 2005 of copending Application 2002-94006.*

(Continued)

*Primary Examiner*—W. David Coleman
(74) *Attorney, Agent, or Firm*—Ostrolenk, Faber, Gerb & Soffen, LLP

(57) ABSTRACT

Provided is a method for manufacturing a semiconductor device, including a dual-stage deposition step including: a first stage for introducing tantalum penta-ethoxide containing tantalum as a material gas into a reaction chamber in which a semiconductor substrate on a surface of which a lower electrode is made of ruthenium is placed to thus form a tantalum oxide film by a vapor-phase growth method such as a chemical vapor deposition method and the following second stage for removing from the reaction chamber the material gas introduced into the reaction chamber at the first stage and a byproduct produced at the first stage by introducing a nitrogen gas, and wherein the tantalum oxide film is formed on the semiconductor substrate, by repeating the dual-stage deposition step two or more times.

34 Claims, 9 Drawing Sheets

OTHER PUBLICATIONS

Notification of Reasons for Refusal dated Mar. 17, 2005 of copending Application 2002-194006.*

Kaupo Kukli et al., "Atomic Layer Deposition and Chemical Vapor Deposition of Tantalum Oxide by Successive and Simultaneous Pulsing of Tantalum Ethoxide and Tantalum Chloride" Chemical Materials 2000, vol. 12, pp. 1914-1920, American Chemical Society.*

Office Action issued by the South Korean Patent Office on Jul. 29, 2005 in connection with corresponding South Korean application No. 2003-52066.

English translation of relevant portions of South Korean Office Action dated Jul. 29, 2005.

Japanese associate's Japanese translation of South Korean Office Action dated Jul. 29, 2005.

Untranslated Office Action issued by Japanese Patent Office on Mar. 22, 2006 in connection with corresponding application No. 2002-220468.

English translation of relevant portions of Examiner's comments in Japanese Office Action issued Mar. 22, 2006 submitted in lieu of statement of relevancy of prior art to present invention.

* cited by examiner

14; capacitive insulating film

16; capacitor
15; upper electrode
17; memory cell

ALD PROCESS FOR CAPACITOR DIELECTRIC

BACKGROUND OF THE INVENTION

1. Field of the Invention

The present invention relates to a method for manufacturing a semiconductor device and, more particularly, to the method for manufacturing the semiconductor device having a capacitor as an information storing capacitive element in which a lower electrode is made of a metal that has a catalytic action such as ruthenium (Ru) or a like.

The present application claims priority of Japanese Patent Application No. 2002-220468 filed on Jul. 29, 2002, which is hereby incorporated by reference.

2. Description of the Related Art

Large Scale Integrations (LSIs) known as a representative of semiconductor devices are roughly classified into memory products and logic products, a former of which in particular has been developed remarkably with an up-growth of recent technologies for manufacturing the semiconductor devices. The memory products are further classified into Dynamic Random Access Memories (DRAMs) and Static Random Access Memories (SRAMs), most of which are made up of a Metal Oxide Semiconductor (MOS) transistor excellent in integration density. The DRAMs, in particular, are advantageous over the SRAM in utilization of a higher integration density and so can be reduced in costs, thus being widely used as memories in various kinds of storages in an information processing device such as a personal digital assistant, a personal computer, and a like.

In the DRAM, one memory cell is made up of a memory-cell selecting transistor, that is, a MOS transistor to be operated as a switch and a capacitor connected to the memory-cell selecting transistor so that information may be stored according to whether the capacitor is charged or not. It is to be noted that as an amount of information to be stored increases with a recent advance of an information-oriented society, an area occupied by the capacitor formed on a semiconductor substrate is decreased, so that a capacitance of the capacitor in each of the memory cells needs to be increased. If the capacitor does not have a capacitance large enough to store information, the memory cell readily malfunctions due to an external noise signal or a like, thus readily encountering various errors represented by a soft error.

Conventionally, as a capacitive insulating film of a DRAM capacitor, there has been used a metal oxide film or a like such as a silicon dioxide ($SiO_2$) film, a silicon nitride (SiN) film, or a tantalum oxide ($Ta_2O_5$) film. Of these capacitive insulating films, the tantalum oxide film, in particular, is a metal oxide film and has a large dielectric constant as compared to the silicon dioxide film, the silicon nitride film, and so can be used as a capacitive insulating film to make up a capacitor having a large capacitance. Such the tantalum oxide film can be formed typically by Chemical Vapor Deposition (CVD), whereby it is easy to form the film. Further, to increase the capacitance of a capacitor, its lower electrode may be shaped in a form of a three-dimensional structure such as a cylinder in some cases.

Further, in a case where a capacitor is made by forming on the lower electrode a capacitive insulating film having a large dielectric constant such as the tantalum oxide films, such metal as ruthenium is used so that if a surface of the lower electrode is oxidized its oxide film may still have conductivity to thus prevent a decrease in capacitance and further, a Metal Insulator Metal (MIM)-type capacitor is used in which metal such as ruthenium is employed as a material of its upper electrode. For example, Japanese Patent Application Laid-open No. 2001-313379 discloses a method for manufacturing a semiconductor device in which a lower electrode is shaped in a form of a three-dimensional structure such as a cylinder and also a MIM-type capacitor is employed, as described above. The following will describe this semiconductor device manufacturing method along its steps with reference to FIG. 11A-11C.

First, as shown in FIG. 11A, for example, on a P-type semiconductor substrate 121, a memory cell transistor 126 made up of an MOS transistor is formed beforehand and a capacitor contact 129 is formed in a contact hole 128 formed in a silicon oxide film 127 and then a plasma oxidized silicon film 131 is formed throughout a surface via a plasma oxy-nitridized silicon film 130. Next, in a cylindrical trench 132 formed in the plasma oxidized silicon film 131, a lower electrode 134 made of ruthenium is formed via a barrier film 133. Next, on the lower electrode 134, a selective growth film 135 made of ruthenium is formed. A reference numeral 122 indicates an element isolation region 122, a reference numeral 123 indicates gate oxide film 123, a reference numeral 124 indicates a gate electrode 124, and a reference numeral 125 indicates an N-type diffusion region 125.

Next, as shown in FIG. 11B, a capacitive insulating film 136 made up of a tantalum oxide film is formed throughout the surface by CVD. The tantalum oxide film is formed by introducing into a reaction chamber an oxygen gas ($O_2$) and a tantalum compound, for example, a tantalum penta-ethoxide ($Ta(OC_2H_5)_5$): hereinafter may be referred simply to as PET) as a material gas. Next, as shown in FIG. 11C, an upper electrode film 137 made of ruthenium is formed and patterned to thus form an upper electrode, thereby forming a capacitor.

A semiconductor device manufacturing method similar to that of the above-described publication is disclosed in, for example, Japanese Patent Application Laid-open No. 2002-26273.

As shown in FIG. 12, after the semiconductor substrate is placed in the reaction chamber kept at a predetermined film formation temperature and a predetermined film formation pressure, at a time t100, a material gas obtained by atomizing and vaporizing PET, which is a tantalum compound, with a nitrogen ($N_2$) carrier gas to vaporize it and an oxygen gas are introduced together into it by the respective predetermined amounts, to start forming a tantalum oxide film. At a time t200 after a predetermined lapse of time, introduction of the material gas and that of the oxygen gas are stopped together. In this case, the oxygen gas is used to fill in oxygen vacancies liable to occur during formation of tantalum oxide films and remove organic matter. Further, by a conventional semiconductor device manufacturing method using the above-described film formation sequence, the material gas is introduced continuously at a time, to form a capacitive insulating film having a finally required film thickness.

However, it is found that by the conventional semiconductor device manufacturing method, the tantalum oxide film grows abnormally depending on a shape of an underlying electrode, that is, the lower electrode 134. It is also found that especially, for example, in a case where the cylindrical trench 132 has a high aspect ratio or the plurality of cylindrical trenches 132 occupies a large area, a capacitive insulating film 136, if made up of the tantalum oxide film by the conventional semiconductor device manufacturing method, grows little in the cylindrical trench 132 but grows abnormally at its upper part during its formation process. Such an abnormal growth has not been observed in a case where the cylindrical trench 132 has a small aspect ratio or the lower electrode 134 has a flat shape instead of a cylindrical shape in construction.

Based on these, the present inventor has concluded that the tantalum oxide film readily grows abnormally owing to the following phenomenon.

If, for example, by the conventional semiconductor device manufacturing method shown in FIGS. 11A-11C, the lower electrode 134 made of ruthenium is formed in the cylindrical trench 132 and then the capacitive insulating film 136 made up of a tantalum oxide film is formed, ruthenium acts as a catalyst to accelerate decomposition of the material gas and hence grow the tantalum oxide film, of which growth is further accelerated by a byproduct containing components of oxygen, carbon, nitrogen, or a like produced by the decomposition. As the decomposition of the material gas goes on, the cylindrical trench 132 is gradually filled with the byproduct until the material gas cannot be supplied into the cylindrical trench 132 any more, whereupon the tantalum oxide film does not grow on a side wall and a bottom of the cylindrical trench 132. At the upper part of the cylindrical trench 132, on the other hand, the byproduct is formed a lot, thereby acting to cause the tantalum oxide film to grow explosively hence abnormally. This deteriorates step coverage drastically.

FIG. 13 is an illustration for schematically showing the capacitive insulating film 136 made up of the tantalum oxide film that has grown abnormally at the upper part of the cylindrical trench 132. If step coverage is deteriorated in such a manner, the upper electrode 137, when subsequently formed on the tantalum oxide film in order to complete a capacitor, short-circuits with the lower electrode 134 readily, thereby resulting in malfunctioning of the capacitor.

SUMMARY OF THE INVENTION

In view of the above, the present invention has been developed, and it is an object of the present invention to provide a method for manufacturing a semiconductor device that can suppress abnormal growth of a metal oxide film when it is formed on a metal film.

According to a first aspect of the present invention, there is provided a method for manufacturing a semiconductor device, including a dual-stage deposition step including:

a first stage for introducing a material gas containing desired metal into a reaction chamber in which a semiconductor substrate on a surface of which a metal film is formed in part or in entirety is placed to thus form an oxide film made of the specified metal by a vapor-phase growth method and the following second stage for removing from the reaction chamber the material gas introduced into the reaction chamber at the first stage and a byproduct produced at the first stage, and wherein the metal oxide film as an oxide of the specified metal is formed on the semiconductor substrate, by repeating the dual-stage deposition step two or more times.

According to a second aspect of the present invention, there is provided a method for manufacturing a semiconductor device having a capacitor, including:

a dual-stage deposition step including:

a first stage for introducing a material gas containing desired metal into a reaction chamber in which a semiconductor substrate on a surface of which a metal film is formed in part or in entirety is placed to thus form an oxide film made of the desired metal by a vapor-phase growth method and the following second stage for removing from the reaction chamber the material gas introduced into the reaction chamber at the first stage and a byproduct produced at the first stage, and wherein the metal oxide film as an oxide of the specified metal is formed on the semiconductor substrate, by repeating the dual-stage deposition step two or more times, thereby forming a capacitive insulating film to make up the capacitor; and forming an upper electrode to make up the capacitor on the capacitive insulating film.

In the foregoing first and second aspects, a preferable mode is one wherein the semiconductor substrate has a cylindrical trench on a surface thereof in such a configuration that the metal film is formed on a bottom and an inner side wall of the cylindrical trench.

Another preferable mode is one wherein the material gas and the byproduct produced at the first stage are removed by introducing a gas different from the material gas at the first stage into the reaction chamber at the second stage.

Still another preferable mode is one wherein the material gas and the byproduct produced at the first stage are removed by depressurizing the reaction chamber at the second stage.

An additional preferable mode is one wherein after having performed the depressurizing at the second stage and before the first stages starts in a next dual-stage deposition step, a gas different from the material gas is introduced into the reaction chamber to thus recover a gas pressure before performing the depressurizing in the reaction chamber.

A still additional preferable mode is one wherein the metal oxide film having a finally required film thickness is formed by repeating the steps a plurality of number of times.

Furthermore preferable mode is one wherein after the steps are repeated a plurality of number of times, the material gas is introduced continuously for a time longer than that required for the first stage, to form the metal oxide film having the finally required film thickness.

Still furthermore preferable mode is one wherein an oxidizing gas is introduced at the first stage.

Another preferable mode is one wherein introduction of the oxidizing gas is started from a second-time the steps.

An additional preferable mode is one wherein the second stage comprises a process for introducing an oxidizing gas and a process for introducing the material gas and a gas different from the oxidizing gas.

A still additional preferable mode is one wherein the gas different from the material gas is an inactive gas.

Furthermore preferable mode is one wherein the inactive gas is a nitrogen gas.

Still furthermore preferable mode is one wherein the metal film is made of metal having a catalytic action.

Also, another preferable mode is one wherein the vapor-phase growth method is a chemical vapor deposition method or a physical vapor deposition method.

Another still another preferable mode is one wherein the metal oxide film as the oxide of the specified metal is made of at least one selected from the group consisting essentially of tantalum, hafnium, zirconium, and niobium.

An additional preferable mode is one wherein tantalum penta-ethoxide is used as the material gas.

A still additional preferable mode is one wherein as the oxidizing gas, a gas containing oxygen, ozone, water, nitrogen oxide, or oxygen radical is used.

Furthermore preferable mode is one wherein as the metal having a catalytic action, ruthenium or platinum is used.

According to a third aspect of the present invention, there is provided a method for manufacturing a semiconductor device, performing a first stage for introducing a material gas containing desired metal into a reaction chamber in which a semiconductor substrate on a right side of which a metal film is formed is placed to thus form an oxide film made of the desired metal by a vapor-phase growth method and the following second stage for removing from the reaction chamber the material gas introduced into the reaction chamber at the first stage and a byproduct produced at the first stage and then introducing the material gas continuously for a lapse of time longer than the first stage, thereby forming an oxide film made of the metal having a finally required film thickness.

With the above configuration, a capacitive insulating film being a metal oxide film is formed by combining a first stage for introducing a material gas containing desired metal into a reaction chamber in which a semiconductor substrate having a metal film formed thereon is placed to thus form an oxide film made of the desired metal on the metal film by a vapor-phase growth method and the following second stage for removing from the reaction chamber the material gas introduced into it at the first stage and a byproduct produced at the first stage in order to provide one step and repeating the step a plurality of number of times to thus form a capacitive insulating film made up of metal oxide films, so that it is possible to remove the byproduct at the second stage after a thin metal oxide film is formed at the first stage, thereby improving step coverage of the capacitive insulating film.

Further, with the above configuration, after performing a first stage for introducing a material gas containing desired metal into a reaction chamber in which a semiconductor substrate having a metal film formed thereon is placed to thus form an oxide film made of the desired metal on the metal film by the vapor-phase growth and the following second stage for removing from the reaction chamber the material gas introduced into it at the first stage and a byproduct produced at the first stage, the material gas is introduced continuously for a longer lapse of time than the first stage to thus form a capacitive insulating film made up of the metal oxide film having a finally required film thickness, so that it is possible to remove the byproduct at the second stage after a thin metal oxide film is formed at the first stage, thereby improving step coverage of the capacitive insulating film.

Therefore, in a case where an oxide film made of metal is formed on a metal film, the metal oxide film can be suppressed from growing abnormally.

Therefore, in a case where a capacitor having a cylindrical structure is formed using metal having a catalytic action as a material of the lower electrode, the capacitive insulating film can be suppressed from growing abnormally.

BRIEF DESCRIPTION OF THE DRAWINGS

The above and other objects, advantages, and features of the present invention will be more apparent from the following description taken in conjunction with the accompanying drawings, in which.

DETAILED DESCRIPTION OF THE PREFERRED EMBODIMENTS

Best mode of carrying out the present invention will be described in further detail using various embodiments with reference to the accompanying drawings. The description is made specifically with reference to the embodiments.

First Embodiment

The following will describe a semiconductor device manufacturing method according to the first embodiment of the present invention with reference to FIGS. 1A to 1G along its steps.

Figure 1A:
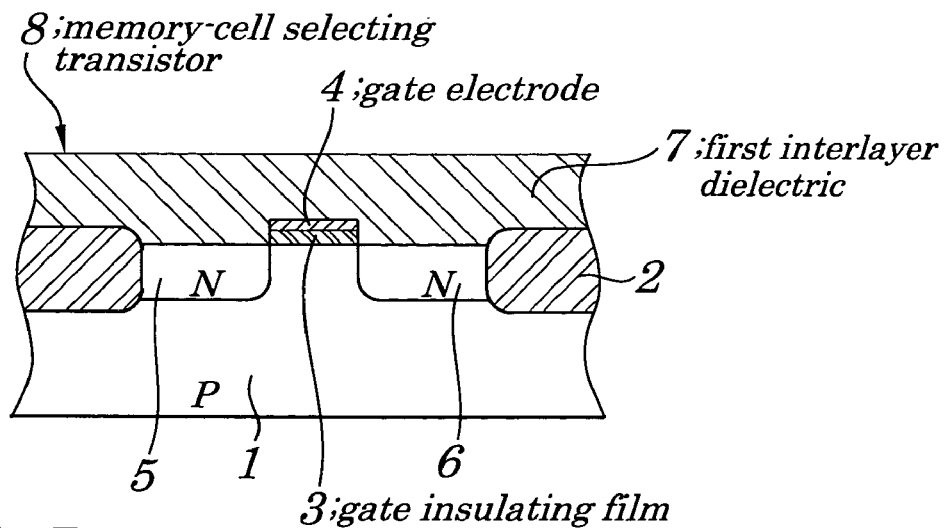
FIGS. 1A-1C are flow diagrams for showing a configuration of a semiconductor device manufacturing method according to a first embodiment of the present invention, along its steps.

First, as shown in FIG. 1A, for example, a P-type of a semiconductor substrate 1 is used to form an element isolation region 2 thereon by a known Local Oxidation of Silicon (LOCOS), Shallow Trench Isolation (STI), or a like, thereby forming at a center of each active region a gate insulating film 3 made up of, for example, a silicon oxide film and a gate electrode 4 made up of, for example, a poly-silicon film. Next, ions of an N-type impurity are implanted by self-alignment by use of the gate electrode 4 to form one pair of N-type regions 5 and 6 which serve as source and drain regions and then, a first interlayer dielectric 7 made up of, for example, a silicon oxide film is formed throughout a surface of the substrate 1, that is, on the element isolation region 2, the gate electrode 4, and the N-type regions 5 and 6, thereby forming a memory-cell selecting transistor 8 being an NMOS (N-type of MOS) transistor.

Figure 1B:
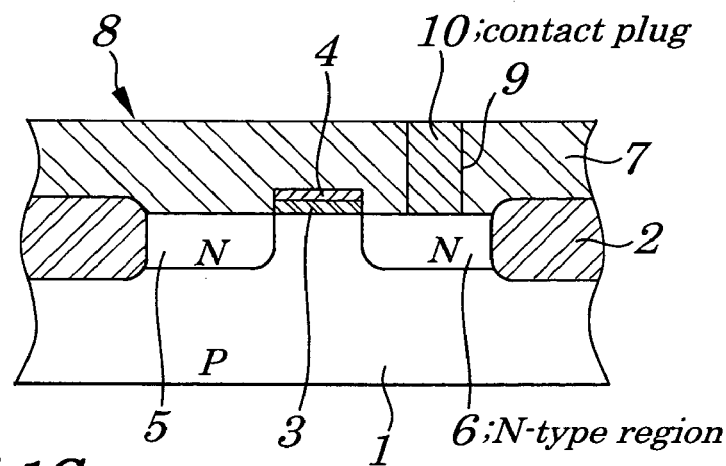

Next, as shown in FIG. 1B, a contact hole 9 to expose either of the two N-type regions 5, 6, the N-type region 6 in the embodiment of the memory-cell selecting transistor 8 is formed in the first interlayer dielectric 7 by photolithography and then, a contact plug 10 made up of, for example, a titanium nitride (TiN) film is formed as buried into the contact hole 9 in such a manner as to connect with the N-type region 6.

Figure 1C:
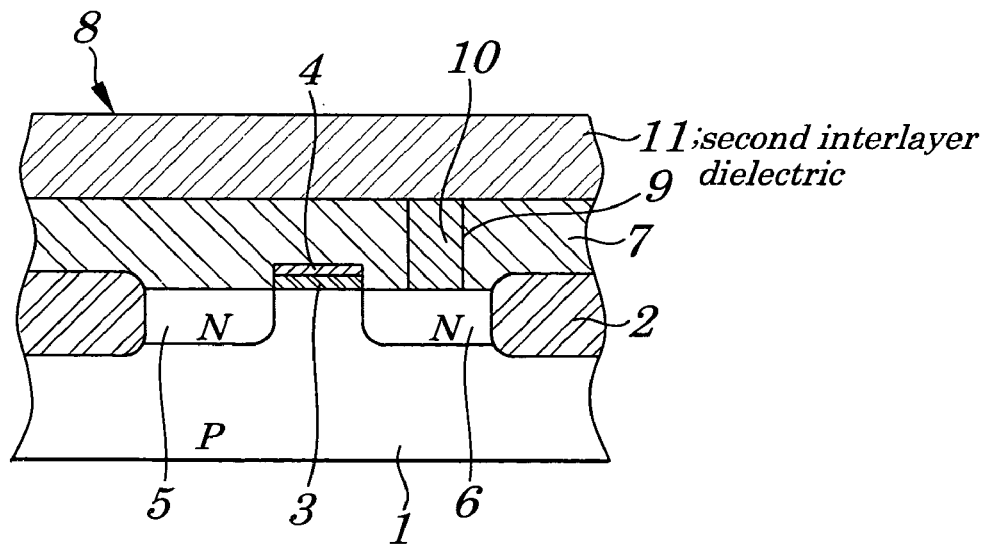
Figure 1D:
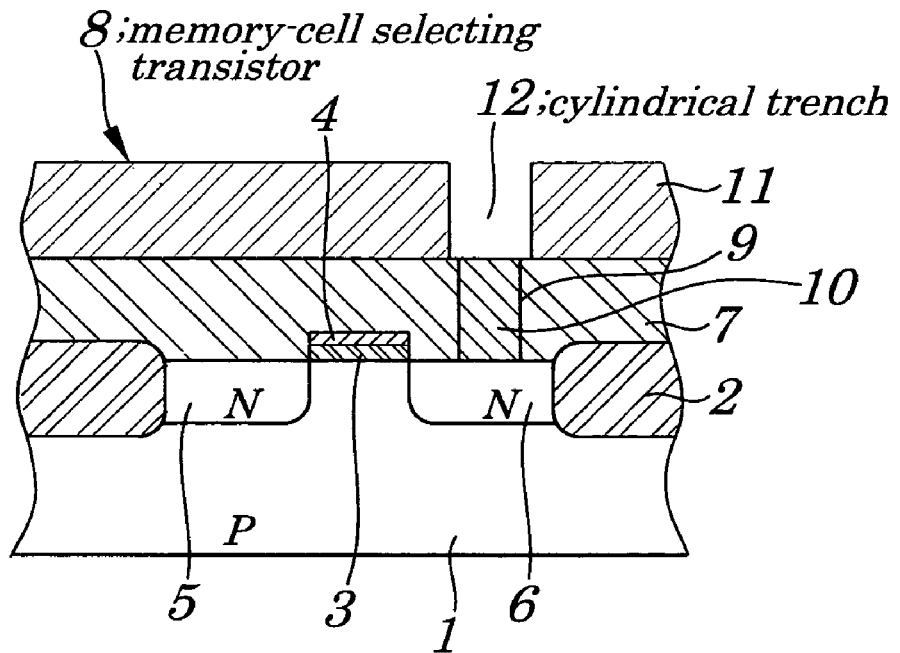
FIGS. 1D-1E are the following flow diagrams for showing the configuration of the semiconductor device manufacturing method according to the first embodiment of the present invention, along its steps.
Figure 1E:
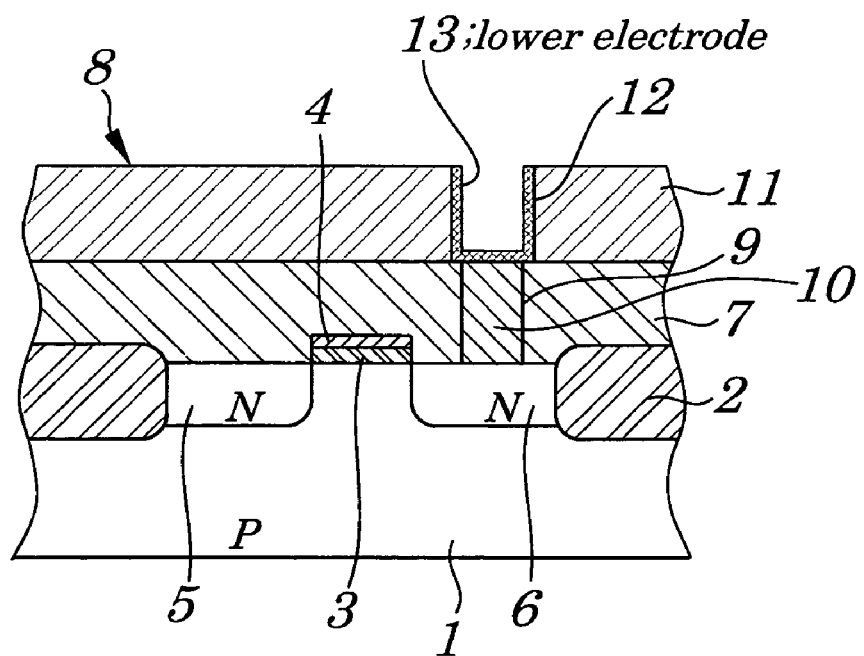

Next, as shown in FIG. 1C, a second interlayer dielectric 11 made of, for example, a silicon oxide film is formed throughout the surface of the first interlayer dielectric 7 including the contact plug 10 and then, as shown in FIG. 1D, a cylindrical trench 12 to expose the contact plug 10 is formed in the second interlayer dielectric 11 by photolithography. Next, a lower electrode film made of, for example, a ruthenium film and having a film thickness of 20 nm is formed throughout the surface of the second interlayer dielectric 11 including an inside of the cylindrical trench 12 by CVD and then, as shown in FIG. 1E, an unnecessary part of the lower electrode film on the second interlayer dielectric 11 is removed by Chemical Mechanical Polishing (CMP), to form a 20-nm thick lower electrode 13 obtained by the lower electrode film thus left only in the cylindrical trench 12.

Figure 1F:
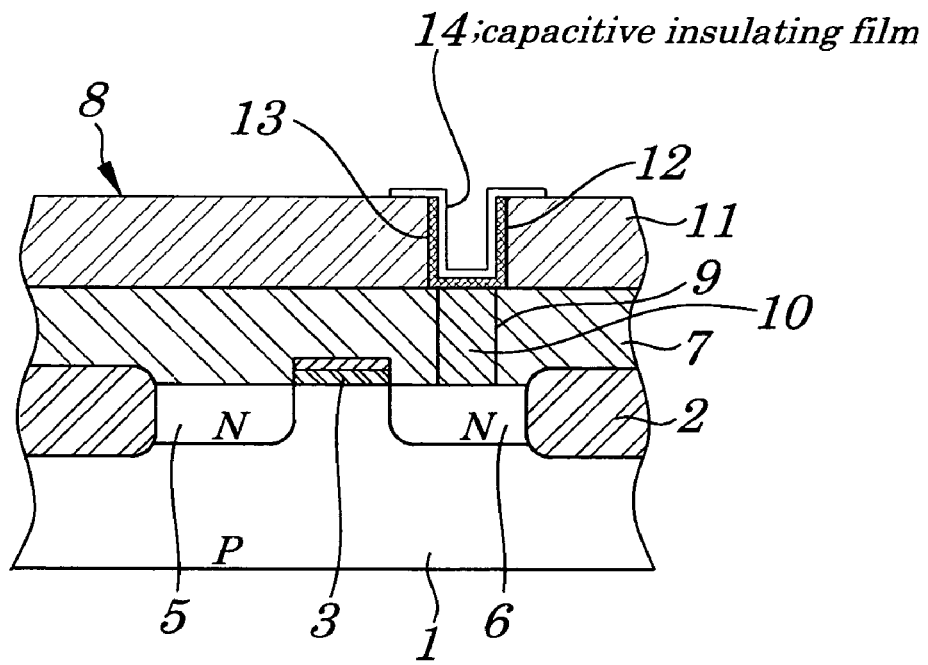
FIGS. 1F-1G are subsequent flow diagrams for showing the configuration of the semiconductor device manufacturing method according to the first embodiment of the present invention, along its steps.
Figure 2:
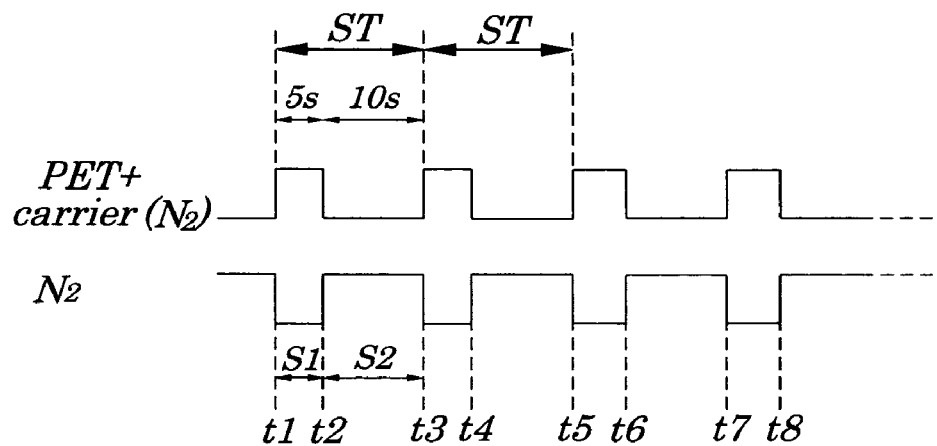
FIG. 2 is a diagram for showing a film formation sequence for forming a tantalum oxide film in the semiconductor device manufacturing method according to the first embodiment of the present invention.

Next, as shown in FIG. 1F, a tantalum oxide film is formed by CVD in accordance with a film formation sequence such as shown in FIG. 2, to form a capacitive insulating film 14 made up of a tantalum oxide film on the lower electrode 13. One example is described below where a tantalum oxide film having a finally required film thickness of 15 nm is formed in a lapse of time of 300 seconds. The following will describe in detail a method for forming the capacitive insulating film 14.

The semiconductor device manufacturing method according to the present embodiment combines a first stage S1 for placing in a reaction chamber the semiconductor substrate 1 on which the lower electrode 13 made of a ruthenium film is formed and then introducing a material gas containing desired metal into the reaction chamber to thus form an oxide film made of the desired metal by CVD and a second stage S2 for removing from the reaction chamber the material gas introduced into the reaction chamber at the first stage S1 and a byproduct produced at the first stage S1 in order to provide one step and repeats the step 60 times, thereby forming the tantalum oxide film not shown or labeled having the finally required film thickness of 15 nm.

That is, as is clear from the film formation sequence of FIG. 2, the silicon substrate 1 is placed in the reaction chamber heated to about 430° C. (film formation temperature) and kept at about 4 Torr (film formation pressure) and then, at a time t1, a material gas obtained by atomizing and vaporizing PET (tantalum penta-ethoxide) using a nitrogen ($N_2$) carrier gas with a flow rate of 500 sccm to vaporize it is introduced into the reaction chamber at a rate of 50 mg/min in accordance with the first stage S1 to thus start deposition of the tantalum oxide film and then, at a time t2 after a lapse of five seconds, introduction of the material gas is stopped. During this lapse of time of five seconds, a 0.25-nm thick tantalum oxide film not shown or numbered is formed. It is to be noted that although the film thickness of the film thus formed is dependent on a temperature, a pressure, a gas flow rate, or a like in the reaction chamber, the present invention assumes that effects of these factors are not taken into account to facilitate understanding. Next, during a lapse of time of 10 seconds from the time t2 to a time t3, a nitrogen gas is introduced as a purge gas at a flow rate of 500 sccm in accordance with the second stage S2, thereby ending the first-time step ST.

The 0.25-nm thick tantalum oxide film formed at the first stage S1 in this first-time step ST has good step coverage throughout the surface of the lower layer made up of the second interlayer dielectric 11 and the lower electrode 13 formed inside of the cylindrical trench 12. That is, since, when the introduction of the material gas is started, there is no byproduct in the reaction chamber, the material gas prevails uniformly throughout the surface including the inside of the cylindrical trench 12, so that the film grows uniformly. Therefore, as in the case of the present embodiment, the film can be formed with good step coverage until it has a small film thickness of about 0.25 nm. However, as the introduction of the material gas continues subsequently as it is, a byproduct is produced a lot, starting to grow abnormally. To prevent this phenomenon, the introduction of the material gas is stopped before that, to remove the byproduct formed at the first stage S1 by causing the nitrogen gas introduced at the second stage S2 to act as a purge gas.

Subsequently, at the time t3, a material gas obtained by atomizing and vaporizing PET using a nitrogen ($N_2$) carrier gas with a flow rate of 500 sccm to vaporize it is introduced into the reaction chamber at a rate of 50 mg/m in accordance with the first stage S1 to thus start forming the tantalum oxide film and then, at a time t4 in five seconds, introduction of the material gas is stopped. During this lapse of time of five seconds, a 0.25-nm thick tantalum oxide film is formed newly. Next, during a lapse of time of 10 seconds from the time t4 to a time t5, a nitrogen gas is introduced as a purge gas at a flow rate of 500 sccm in accordance with the second stage S2, thereby ending the second-time step ST.

The 0.25-nm thick tantalum oxide film newly formed at the first stage S1 in this second-time step ST also has good step coverage throughout the surface including the inside of the cylindrical trench 12. That is, since the byproduct formed at the first stage S1 in the first-time step ST is removed by the nitrogen gas beforehand at the second stage S2 in the first-time step ST and there is no byproduct in the chamber when the material gas is introduced at the first stage S1 in the second-time step ST, the material gas prevails uniformly throughout the surface of the upper layer including the inside of the cylindrical trench 12, so that the film grows uniformly. Therefore, the film can be formed with good step coverage also in the second-time step ST as in the case of the first-time step ST.

Subsequently, since, from the third-time step ST onward also, when the introduction of the material gas is started at the first stage S1, there is no byproduct in the reaction chamber because it is already removed by the nitrogen gas at the second stage S2 in the previous step ST, the material gas prevails uniformly throughout the surface of the lower layer including the inside of the cylindrical trench 12, so that the tantalum oxide film can deposite and grows uniformly. Therefore, as in the previous step ST, the film can be formed with good step coverage. Further, by repeating the step ST 60 times, the capacitive insulating film 14 made up of a tantalum oxide film having the finally required film thickness of 15 nm (0.25 nm times 60) can be formed on the lower electrode 13.

Next, when the capacitive insulating film 14 is formed completely, the substrate 1 is moved into another reaction chamber, where it is subject to annealing processing at, for example, 550-600° C. in an oxidizing atmosphere or oxygen radical processing, thereby stabilizing the tantalum oxide film.

Figure 1G:
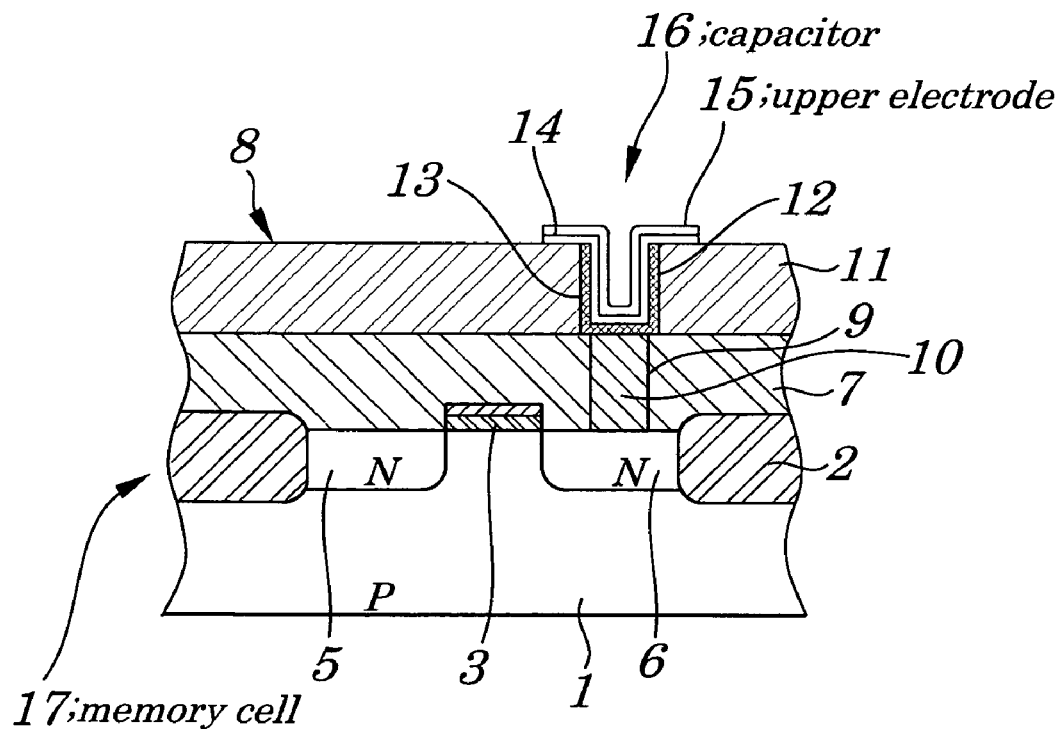

Next, as shown in FIG. 1G, an upper electrode 15 made up of, for example, a ruthenium film is formed on the capacitive insulating film 14, thereby forming a capacitor 16. In such a manner, a memory cell 17 to store one-bit information is completed, in which the capacitor 16 is connected via the contact plug 10 to either of the two N-type regions 5, 6, N-type region 6 in the embodiment as shown in FIGS. 1B, 1C and a like, of the memory-cell selecting transistor 8 being the NMOS transistor.

Figure 3:
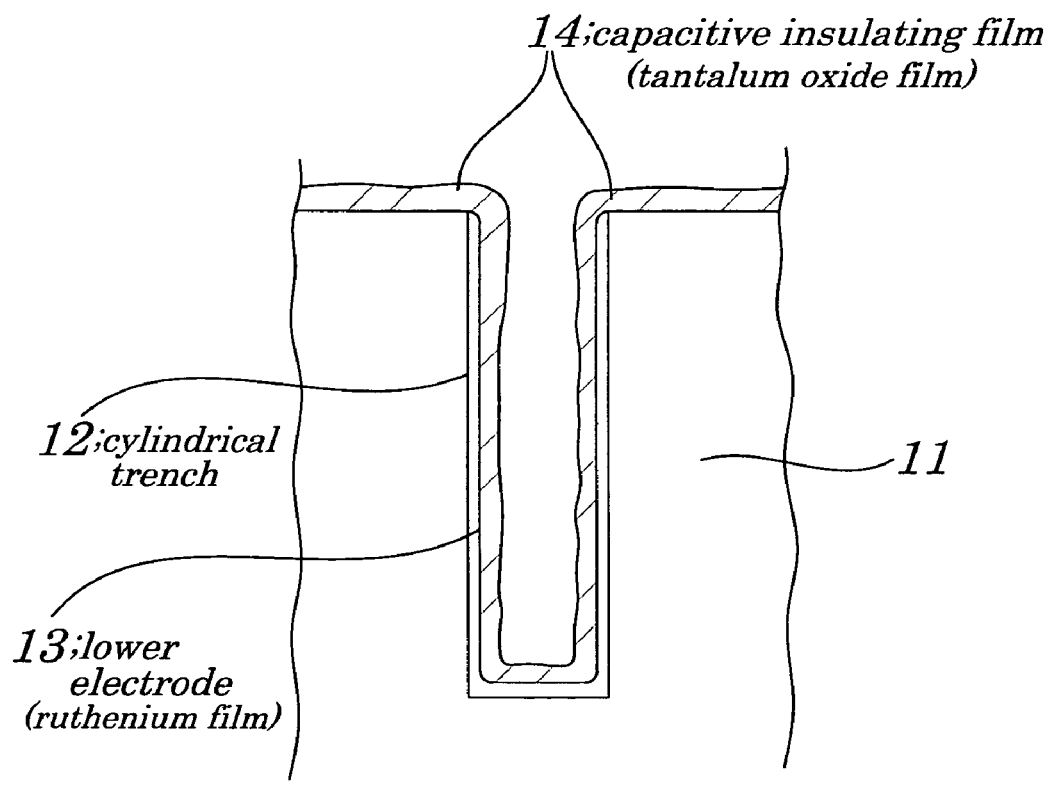
FIG. 3 is an illustration for schematically showing a tantalum oxide film formed in the semiconductor device manufacturing method according to the first embodiment of the present invention.

As can be seen from FIG. 3, by the present embodiment, it is possible to prevent abnormal growth while forming a tantalum oxide film on a sidewall and a bottom in the cylindrical trench 12 roughly uniformly in such a manner that the film may have good step coverage.

Further, the semiconductor device manufacturing method of the present embodiment can suppress abnormal growth of the capacitive insulating film 14 and so can be applied especially to a capacitor 16 with a pattern having a large aspect ratio and a large area occupied by the cylindrical trenches 12, to realize the capacitor 16 with a large capacitance easily.

Second Embodiment

A semiconductor device manufacturing method of the second embodiment greatly differs in configuration from that of the first embodiment described above in that such a step as described above is repeated a plurality of number of times and, subsequently, a material gas is introduced continuously to form a tantalum oxide film having a film thickness (15 nm as in the case of the first embodiment) finally required as a capacitive insulating film. The following will describe the semiconductor device manufacturing method with reference to FIG. 4.

Figure 4:
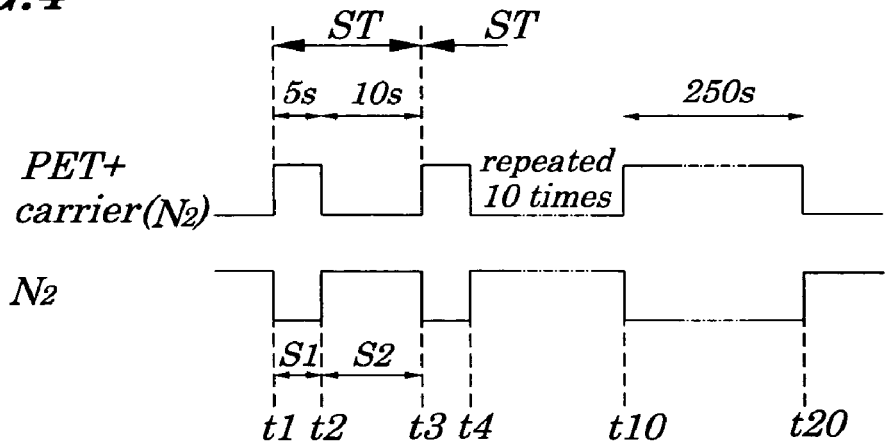
FIG. 4 is a diagram for showing a film formation sequence for forming a tantalum oxide film in a semiconductor device manufacturing method according to a second embodiment of the present invention.

That is, instead of performing a step of FIG. 1F of the first embodiment, the tantalum oxide film is formed in accordance with a film formation sequence of FIG. 4, to form a capacitive insulating film 14 made up of the tantalum oxide film on a lower electrode 13.

By the semiconductor device manufacturing method of the present embodiment, a step ST similar to that of the first embodiment is repeated 10 times and, subsequently, a material gas is continuously introduced until the finally required film thickness (15 nm) is obtained, thereby forming the tantalum oxide film. That is, as is clear from the film formation sequence of FIG. 4, a substrate 1 is placed in a reaction chamber heated to about 430° C. and kept at about 4 Torr and then, at a time t1, a material gas obtained by atomizing and vaporizing PET using a nitrogen carrier gas with a flow rate of 500 sccm to vaporize it is introduced into the reaction chamber at a rate of 50 mg/m in accordance with the first stage S1 to thus start forming the tantalum oxide film and then, at a time t2 after a lapse of five seconds, introduction of the material gas is stopped, so that during this lapse of time of five seconds, a 0.25-nm thick tantalum oxide film is formed. Next, during a lapse of time of 10 seconds from the time of t2 to a time t3, a nitrogen gas is introduced as a purge gas at a flow rate of 500 sccm in accordance with the second stage S2, thereby ending the first-time step ST.

Next, this step ST is repeated ten times and then, during a lapse of time from a time t10 to a time t20 the material gas is continuously introduced into the reaction chamber for 250 seconds, to form a tantalum oxide film having a film thickness of 12.5 nm, thereby forming the capacitive insulating film 14 made up of a tantalum oxide film having the finally required film thickness of 15 nm (0.25 nm times 10 plus 12.5 nm) on the lower electrode 13.

Although the lower electrode is exposed completely in an initial state of formation of the tantalum oxide film and, therefore, the material ruthenium of the lower electrode has a strong catalytic action and abnormal growth is especially liable to occur, as the lower electrode is covered gradually by the tantalum oxide film, the catalytic action by the lower electrode becomes less active, thereby decreasing a degree of the abnormal growth. Therefore, by the present embodiment, in the initial film formation state where the abnormal growth is liable to occur excessively, a step ST including film formation and purging is repeated so that after the lower electrode is covered by the tantalum oxide film to some extent the tantalum oxide film may be continuously formed until it has a finally required film thickness.

Subsequently, as in the case of the first embodiment, after annealing processing or a like are performed, roughly the same step as that of FIG. 1G is repeated, to form an upper electrode 15 made of, for example, ruthenium on the capacitive insulating film 14, thereby completing a memory cell 17 having a capacitor 16 formed thereon.

As described above, by the semiconductor device manufacturing method of the present embodiment, as in the case of the above-mentioned first embodiment, since there is no byproduct in the reaction chamber when introduction of a material gas is started, the material gas prevails throughout the surface including an inside of a cylindrical trench 12, so that a 0.25-nm thick tantalum oxide film to be formed at the first stage S1 in the first-time step ST grows uniformly. Further, since a byproduct is already removed by a nitrogen gas at the second stage S2 in the previous step ST when the material gas is introduced at the first stage S1, the material gas prevails throughout the surface including the inside of the cylindrical trench 12, so that a 0.25-nm thick tantalum oxide film to be formed at the first stage S1 in each of the second-time to tenth-time steps ST can grow uniformly, thereby forming a capacitive insulating film 14 with good step coverage.

Thereafter, a tantalum oxide film having a remaining film thickness is continuously formed, so that because of a smaller number of times of repetitions a throughput can be improved despite somewhat deteriorated step coverage, as compared to the first embodiment. Therefore, in such a case that an aspect ratio is not so large, the present embodiment can be applied to improve the throughput while obtaining sufficiently good step coverage.

Although the second embodiment has been described in an example of repeating the step ST ten times, it may be repeated more or less. Further, rather than repeating the step ST, the step ST may be performed only once to then introduce a material gas continuously until a finally required film thickness is obtained, thereby forming a tantalum oxide film. That is, in the film formation sequence of FIG. 4 for the second embodiment, a material gas is introduced during a lapse of time of five seconds from the time t1 to the time t2 of the first stage S1 to form a 0.25-nm thick tantalum oxide film and then, during a lapse of time of 10 seconds from the time t2 to the time t3, a nitrogen gas is introduced as a purge gas to remove a byproduct formed at the first stage S1. Next, during a lapse of time of 295 seconds corresponding to the times of t10 to t20, the material gas is continuously introduced to form a 14.75-nm thick tantalum oxide film, thereby forming on the lower electrode 13 the capacitive insulating film 14 made up of a tantalum oxide film having a finally required film thickness of 15 nm (0.25 nm plus 14.75 nm).

In such a manner, even by performing the step ST only once, step coverage can be improved sufficiently as compared to the case of the conventional technologies.

Third Embodiment

A semiconductor device manufacturing method of the third embodiment greatly differs in configuration from that of the second embodiment described above in that a step ST is repeated a larger number of times than in the case of the second embodiment and then, an oxidizing gas is introduced together with a material gas in a period when the material gas is continuously introduced until a capacitive insulating film 14 has a finally required film thickness (15 nm as in the case of the first embodiment). The following will describe the semiconductor device manufacturing method with reference to FIG. 5.

Figure 5:
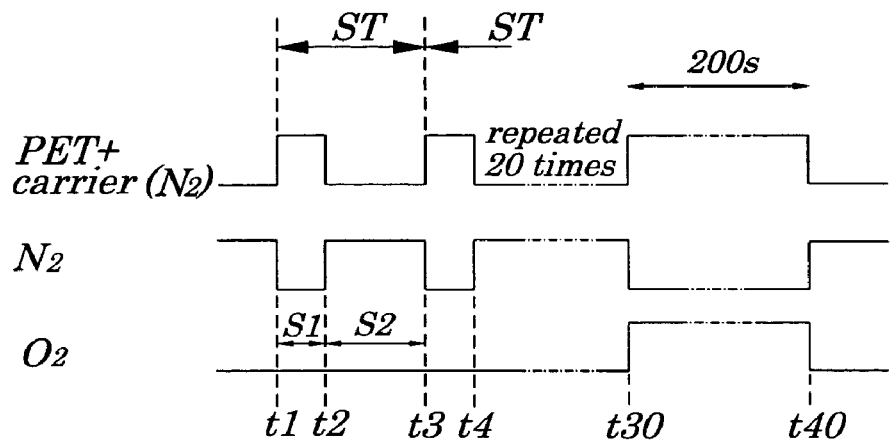
FIG. 5 is a diagram for showing a film formation sequence for forming a tantalum oxide film in a semiconductor device manufacturing method according to a third embodiment of the present invention.

That is, instead of performing a step of FIG. 1F of the first embodiment, a tantalum oxide film is formed in accordance with a film formation sequence of FIG. 5, to form a capacitive insulating film 14 made up of the tantalum oxide film on a lower electrode 13.

By the semiconductor device manufacturing method of the third embodiment, a step ST similar to that of the second embodiment is repeated 20 times and then, an oxidizing gas is introduced together with a material gas in a period when the material gas is continuously introduced until the finally required film thickness (15 nm) is obtained, thereby forming the tantalum oxide film. That is, as is clear from the film formation sequence of FIG. 5, the step ST similar to that of the second embodiment is repeated 20 times and then, the material gas and an oxygen ($O_2$) gas are introduced into a reaction chamber for 200 seconds in a period from a time t30 to a time t40, thereby forming, on the lower electrode 13, the capacitive insulating film 14 being a tantalum oxide film having the finally required film thickness of 15 nm (0.25 nm times 20 plus 10 nm).

Subsequently, as in the case of the first embodiment, after annealing processing or a like are performed, roughly the same step as that of FIG. 1G is repeated, to form an upper electrode 15 made of, for example, ruthenium on the capacitive insulating film 14, thereby completing a memory cell 17 having a capacitor 16 formed thereon.

As described above, by the semiconductor device manufacturing method of the present embodiment, as described with the second embodiment, since there is no byproduct in the reaction chamber when introduction of a material gas is started, the material gas prevails throughout the surface including an inside of a cylindrical trench 12, so that a 0.25-nm thick tantalum oxide film to be formed at a first stage S1 in the first-time step ST grows uniformly. Further, since a byproduct is already removed by a nitrogen gas at a second stage S2 in the previous step ST when a material gas is introduced at the first stage S1, the material gas prevails throughout the surface including the inside of the cylindrical trench 12, so that a 0.25-nm thick tantalum oxide film to be formed at the first stage S1 in each of the second-time to twentieth-time steps ST can grow uniformly, thereby forming a capacitive insulating film 14 with good step coverage.

Further, by the semiconductor device manufacturing method of the present embodiment, an oxygen gas can be introduced together with a material gas in a period when it is introduced continuously, to improve a film quality of a capacitive insulating film 14 because the oxygen gas acts to fill in oxygen vacancies liable to occur during formation of a tantalum oxide film and also remove organic matter. If an oxygen gas is introduced together with a material gas, the oxygen gas accelerates formation of a byproduct, so that abnormal growth occurs readily. Therefore, in the present embodiment, the first-time step ST is repeated a larger number of times than in the case of the second embodiment, thereby suppressing the abnormal growth.

Fourth Embodiment

A semiconductor device manufacturing method of the fourth embodiment greatly differs in configuration from that of the first embodiment described above in that when forming a tantalum oxide film having a film thickness (15 nm as in the case of the first embodiment) finally required as a capacitive insulating film 14 by repeating the first and second stages a plurality of number of times, an oxidizing gas is introduced together with a material gas in a period when the material gas is introduced. The following will describe the semiconductor device manufacturing method with reference to FIG. 6.

Figure 6:
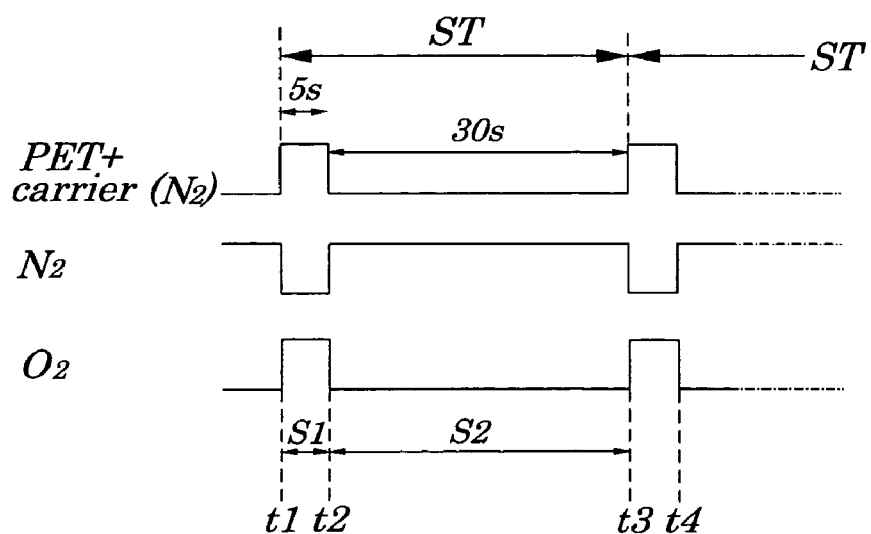
FIG. 6 is a diagram for showing a film formation sequence for forming a tantalum oxide film in a semiconductor device manufacturing method according to a fourth embodiment of the present invention.

That is, instead of performing a step of FIG. 1F of the first embodiment, the tantalum oxide film is formed in accordance with a film formation sequence of FIG. 6, to form a capacitive insulating film 14 made up of the tantalum oxide film on a lower electrode 13.

By the semiconductor device manufacturing method according to the fourth embodiment, when repeating 60 times one step ST including a first stage S1 for introducing a material gas for film formation as in the case of the first embodiment and a second stage S2 for introducing a nitrogen gas as a purge gas, an oxygen gas is introduced in a period of the first stage S1 in each of the steps ST and a lapse of time of the second stage S2 is made longer in duration than that of the first embodiment, to form a tantalum oxide film having the finally required film thickness (15 nm). That is, as is clear from the film formation sequence of FIG. 6, a substrate 1 is placed in a reaction chamber heated to about 430° C. and kept at about 4 Torr and then, at a time t1, a material gas obtained by atomizing and vaporizing PET using a nitrogen carrier gas with a flow rate of 500 sccm to vaporize it is introduced into the reaction chamber at a rate of 50 mg/m in accordance with the first stage S1 to thus start forming the tantalum oxide film and then, at a time t2 after a lapse of five seconds, introduction of the material gas is stopped. During this lapse of time of five seconds, a 0.25-nm thick tantalum oxide film is formed. Next, during a lapse of time of 30 seconds from the time t2 to a time t3, a nitrogen gas is introduced as a purge gas at a flow rate of 1500 sccm in accordance with the second stage S2, thereby ending the first-time step ST.

Subsequently, by similarly performing the second-time to sixtieth-time steps ST, a capacitive insulating film 14 made up of a tantalum oxide film having the finally required film thickness of 15 nm is formed on a lower electrode 13.

In the present embodiment, an oxygen gas is introduced at the first stage, so that a byproduct is more readily produced than in a case where it is not introduced. Therefore, the second stage is prolonged in order to sufficiently remove the byproduct before the next step ST starts.

Subsequently, as in the case of the first embodiment, after annealing processing or a like are performed, roughly the same step as that of FIG. 1G is repeated to form an upper electrode 15 made of, for example, ruthenium on the capacitive insulating film 14, thereby completing a memory cell 17 having a capacitor 16 formed thereon.

As described above, by the semiconductor device manufacturing method of the present embodiment, as described with the first embodiment, since there is no byproduct in the reaction chamber when introduction of a material gas is started, the material gas prevails throughout a surface including an inside of a cylindrical trench 12, so that a 0.25-nm thick tantalum oxide film to be formed at the first stage S1 in the first-time step ST grows uniformly. Further, since a byproduct is already removed by a nitrogen gas at the second stage S2 in the previous step ST when a material gas is introduced at the first stage S1, the material gas prevails throughout the surface including the inside of the cylindrical trench 12, so that a 0.25-nm thick tantalum oxide film to be formed at the first stage 51 in each of the second-time to sixtieth-time steps ST can grow uniformly, thereby forming a capacitive insulating film 14 with good step coverage.

Further, by the semiconductor device manufacturing method of the present invention, it is possible not only to improve a film quality of the capacitive insulating film 14 because an oxygen gas is introduced in a period in each of the steps ST when a material gas is introduced but also to obtain a large margin against abnormal growth of the capacitive insulating film 14 because the second stage S2 is made longer in duration than the first stage S1 in each of the steps St than in the case of the first embodiment to thus prolong a lapse of time during which a byproduct can be removed at the second stage S2 in each of the steps ST.

Fifth Embodiment

A semiconductor device manufacturing method of the fifth embodiment greatly differs in configuration from that of the fourth embodiment described above in that when forming a tantalum oxide film having a film thickness (15 nm as in the case of the first embodiment) finally required as a capacitive insulating film 14 by repeating the first and second stages a plurality of number of times, a reaction chamber is depressurized at the second stage in each of steps. The following will describe the semiconductor device manufacturing method with reference to FIG. 7.

Figure 7:
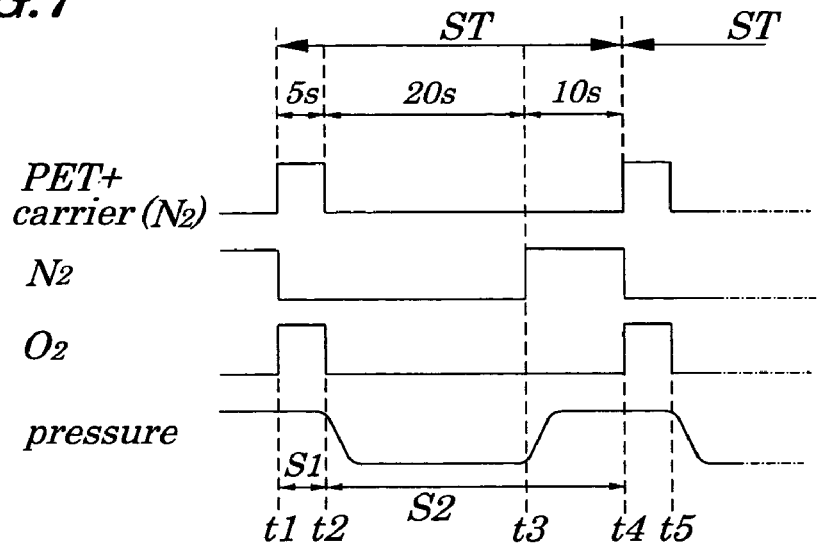
FIG. 7 is a diagram for showing a film formation sequence for forming a tantalum oxide film in a semiconductor device manufacturing method according to a fifth embodiment of the present invention.

That is, instead of performing a step of FIG. 1F of the first embodiment, the tantalum oxide film is formed in accordance with a film formation sequence of FIG. 7, to form a capacitive insulating film 14 made up of the tantalum oxide film on a lower electrode 13.

By the semiconductor device manufacturing method according to the fifth embodiment, when repeating 60 times one step ST including a first stage S1 for introducing a material gas to form a tantalum oxide film and a second stage S2 for removing a byproduct produced at the first stage, an oxygen gas is introduced in a period of the first stage S1 in each of the steps ST and the reaction chamber is depressurized at the second stage S2 in each of the steps, thereby forming a tantalum oxide film having the finally required film thickness (15 nm). That is, as is clear from the film formation sequence of FIG. 7, a substrate 1 is placed in the reaction chamber heated to about 430° C. and kept at about 4 Torr and then, at a time t1, a material gas obtained by atomizing and vaporizing PET using a nitrogen carrier gas with a flow rate of 500 sccm to vaporize it is introduced into the reaction chamber at a rate of 50 mg/m together with an oxygen gas with a flow rate of 500 sccm in accordance with the first stage S1 to thus start forming the tantalum oxide film and then, at a time t2 after a lapse of five seconds, introduction of the material gas is stopped. During this lapse of time of five seconds, a 0.25-nm thick tantalum oxide film is formed. Next, during a lapse of time of 20 seconds from the time t2 to a time t3 halfway through the second stage S2, the reaction chamber kept at 4 Torr as described above is evacuated to about 0.1 Torr and then, during a lapse of time of 10 seconds from the time t3 to a time t4, a nitrogen gas is introduced as a pressure regulation gas at a flow rate of 1000 sccm, thereby ending the first-time step ST.

Subsequently, by similarly performing the second-time to sixtieth-time steps ST, a capacitive insulating film 14 made up of a tantalum oxide film having the finally required film thickness of 15 nm is formed on a lower electrode 13.

In the fifth embodiment also, although a byproduct is produced a lot because an oxygen gas is introduced together with the material gas at the first stage as in the case of the fourth embodiment, the byproduct produced at the first stage S1 can be removed by decreasing a film formation pressure at the second stage S2 in each of the steps ST as described above. In this case, a capacity of removing the byproduct can be enhanced by depressurization than by introduction of a purge gas, thereby improving an action to suppress abnormal growth of the capacitive insulating film 14. However, some pressure regulated time is required in order to recover an original pressure (4 Torr) required for film formation at the first stage S1 in the next step after depressurization at the second stage S2 in each of the steps, so that pressure regulation must be prepared halfway (at the time t3) through the second stage S2. Therefore, by introducing a nitrogen gas as the pressure regulated gas during a lapse of time of 10 seconds from the time t3 to a time t4 halfway through the second stage S2, film formation operation can be started smoothly at the time t4 in the next step ST.

Subsequently, as in the case of the first embodiment, after annealing processing or a like are performed, roughly the same step as that of FIG. 1G is repeated, to form an upper electrode 15 made of, for example, ruthenium on the capacitive insulating film 14, thereby completing a memory cell 17 having a capacitor 16 formed thereon.

As described above, by the semiconductor device manufacturing method of the present embodiment, as described with the first embodiment, since there is no byproduct in the reaction chamber when introduction of a material gas is started, the material gas prevails throughout a surface including an inside of a cylindrical trench 12, so that a 0.25-nm thick tantalum oxide film to be formed at the first stage S1 in the first-time step ST grows uniformly. Further, since a byproduct is already removed by depressurization and use of a nitrogen gas at the second stage S2 in the previous step ST when a material gas is introduced at the first stage S1 the material gas prevails throughout the surface including the inside of the cylindrical trench 12, so that a 0.25-nm thick tantalum oxide film to be formed at the first stage S1 in each of the second-time to sixtieth-time steps ST can grow uniformly, thereby improving step coverage of the capacitive insulating film 14.

Further, by the semiconductor device manufacturing method of the present invention, it is possible not only to improve an action to suppress abnormal growth of the tantalum oxide film because the byproduct is removed by depressurization but also to improve a film quality of the capacitive insulating film because an oxygen gas is introduced in a period in each of the steps ST when a material gas is introduced.

Sixth Embodiment

A semiconductor device manufacturing method of the sixth embodiment greatly differs in configuration from that of the fifth embodiment described above in that when forming a tantalum oxide film having a film thickness (15 nm as in the case of the first embodiment) finally required as a capacitive insulating film 14 by repeating the first and second stages a plurality of number of times, an oxygen gas is introduced from the second-time step onward. The following will describe the semiconductor device manufacturing method with reference to FIG. 8.

Figure 8:
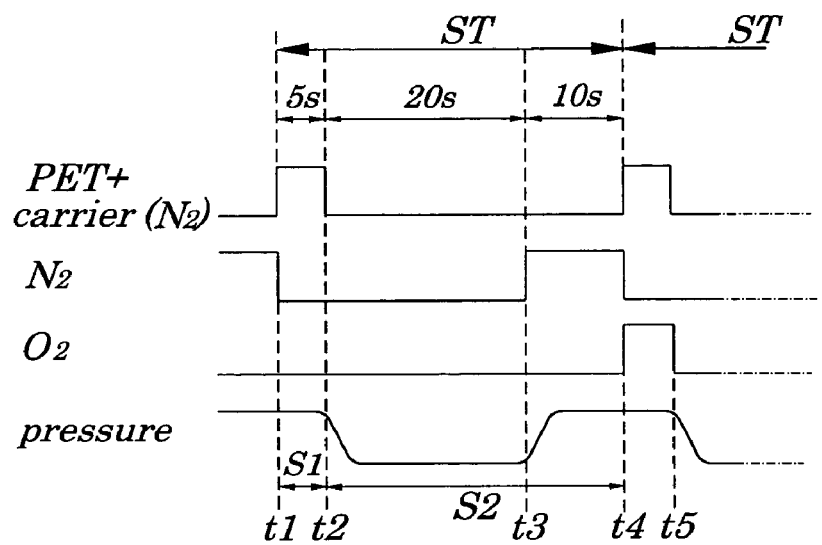
FIG. 8 is a diagram for showing a film formation sequence for forming a tantalum oxide film in a semiconductor device manufacturing method according to a sixth embodiment of the present invention.

That is, instead of performing a step of FIG. 1F of the first embodiment, the tantalum oxide film is formed in accordance with a film formation sequence of FIG. 8, to form a capacitive insulating film 14 made up of the tantalum oxide film on a lower electrode 13.

By the semiconductor device manufacturing method according to the present embodiment, when repeating 60 times one step ST including a first stage S1 for introducing a material gas for film formation as in the case of the fifth embodiment and a second stage S2 for introduction of a nitrogen gas as a purge gas, a reaction chamber is depressurized at the second stage S2 in each of the steps and also an oxygen gas is introduced from the first stage S1 in the second-time step ST, thereby forming a tantalum oxide film having the finally required film thickness (15 nm). That is, as is clear from the film formation sequence of FIG. 8, the oxygen gas is introduced at a flow rate of 500 sccm during a lapse of time of five seconds from a time t4 to a time t5 at the first stage S1 in each of the second-time and subsequent steps ST.

Except for this, the present embodiment is roughly the same as the fifth embodiment, so that description of contents of FIG. 8 that correspond to those of FIG. 7 is omitted. By repeating the step ST 60 times in such a manner, the capacitive insulating film 14 made up of a tantalum oxide film having the finally required film thickness of 15 nm is formed on the lower electrode 13.

Subsequently, as in the case of the first embodiment, after annealing processing or a like are performed, roughly the same step as that of FIG. 1G is repeated, to form an upper electrode 15 made of, for example, ruthenium on the capacitive insulating film 14, thereby completing a memory cell 17 having a capacitor 16 formed thereon.

As described above, by the semiconductor device manufacturing method of the sixth embodiment, as described with the fifth embodiment, since there is no byproduct in the reaction chamber when introduction of a material gas is started, the material gas prevails throughout a surface including an inside of a cylindrical trench 12, so that a 0.25-nm thick tantalum oxide film to be formed at the first stage S1 in the first-time step ST grows uniformly. Further, since a byproduct is already removed by a nitrogen gas at the second stage S2 in the previous step ST when a material gas is introduced at the first stage S1, the material gas prevails throughout the surface including the inside of the cylindrical trench 12, so that a 0.25-nm thick tantalum oxide film to be formed at the first stage S1 in each of the second-time to sixtieth-time steps ST can grow uniformly, thereby improving step coverage of the capacitive insulating film 14.

Further, by the semiconductor device manufacturing method of the present embodiment, with respect to that of the fifth embodiment, introduction of an oxygen gas is delayed in starting from the first stage S1 in the second-time step ST not from the first stage in the first-time step ST, so that it is possible to delay production of a byproduct involved in earlier introduction of the oxygen gas, thereby improving an action to suppress abnormal growth of the capacitive insulating film 14. That is, an oxygen gas, of which introduction is necessary to improve a film quality of the capacitive insulating film 14, acts to accelerate production of a byproduct. Therefore, if it is introduced from the beginning, the byproduct is produced earlier than otherwise, so that abnormal growth occurs readily, leading to deterioration in step coverage. Especially if an oxygen gas is introduced to a place where the lower electrode 13 made of ruthenium is exposed completely, a byproduct is produced excessively, so that abnormal growth is liable to occur. Therefore, by the sixth embodiment, introduction of an oxygen gas is started from the second-time step ST to thus delay abnormal growth. It is thus possible to improve the film quality of the capacitive insulating film 14 without deteriorating its step coverage. It is to be noted that the introduction of an oxygen gas may be further delayed in starting from the first stage S1 in the third-time step ST, because the more delayed is the introduction of the oxygen gas, the more improved is an action to suppress the abnormal growth.

Seventh Embodiment

A semiconductor device manufacturing method of the seventh embodiment greatly differs in configuration from that of the first embodiment described above in that when forming a tantalum oxide film having a film thickness (15 nm as in the case of the first embodiment) finally required as a capacitive insulating film 14 by repeating the first and second stages a plurality of number of times, the second stage comprises a process for introducing an oxidizing gas and a process for introducing a material gas and a gas different from the oxidizing gas. The following will describe the semiconductor device manufacturing method with reference to FIG. 9.

Figure 9:
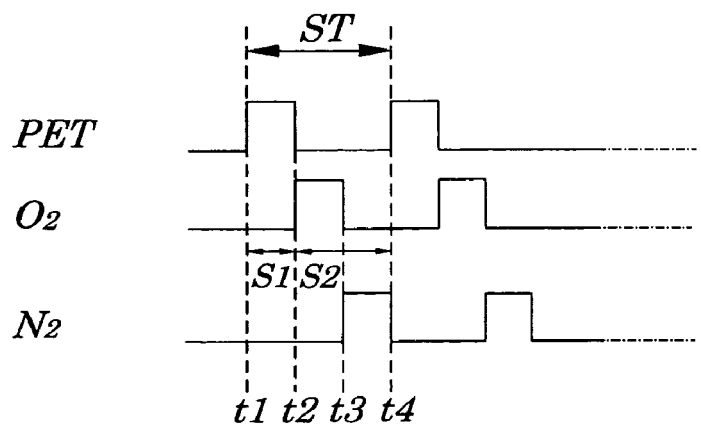
FIG. 9 is a diagram for showing a film formation sequence for forming a tantalum oxide film in a semiconductor device manufacturing method according to a seventh embodiment of the present invention.

That is, instead of performing a step of FIG. 1F of the first embodiment, the tantalum oxide film is formed in accordance with a film formation sequence of FIG. 9, to form a capacitive insulating film 14 made up of the tantalum oxide film on a lower electrode 13.

Figure 11A:
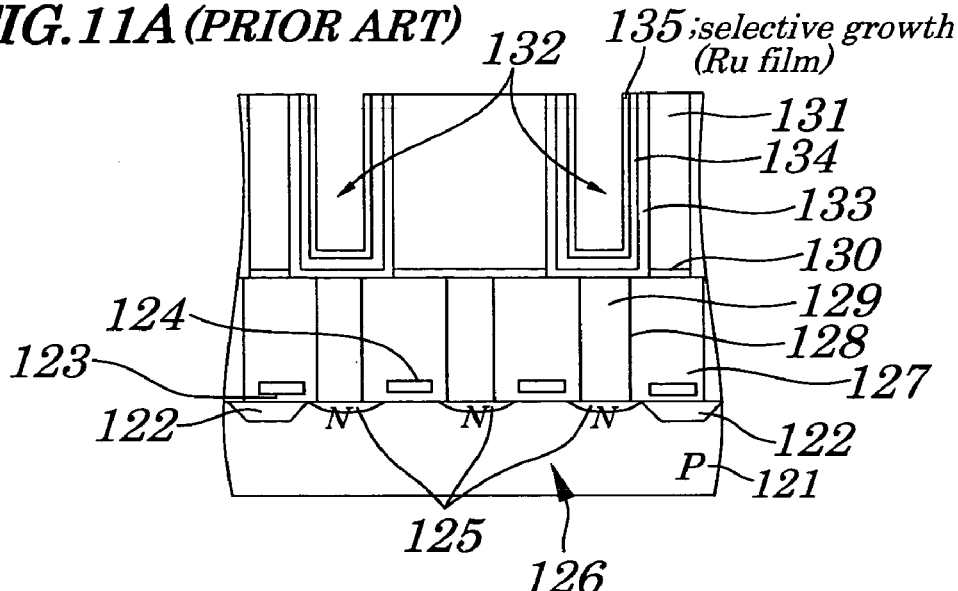
FIGS. 11A-11C are flow diagrams for showing a conventional semiconductor device manufacturing method along its steps.
Figure 11B:
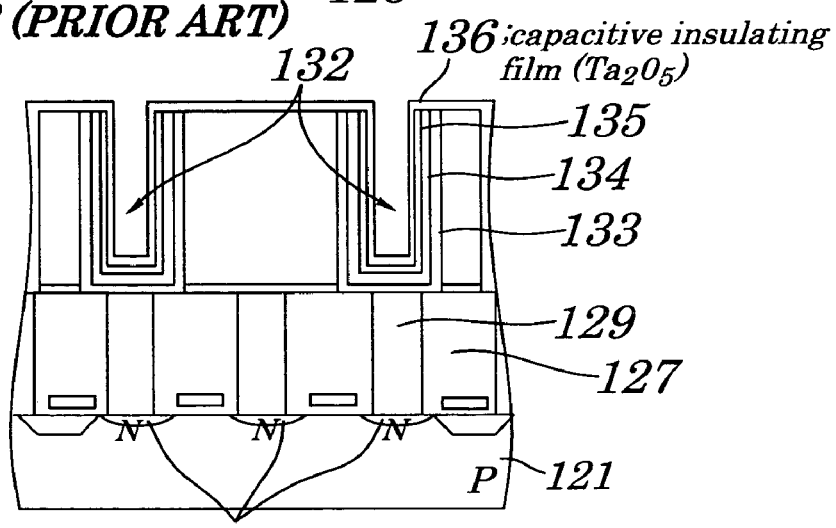
Figure 11C:
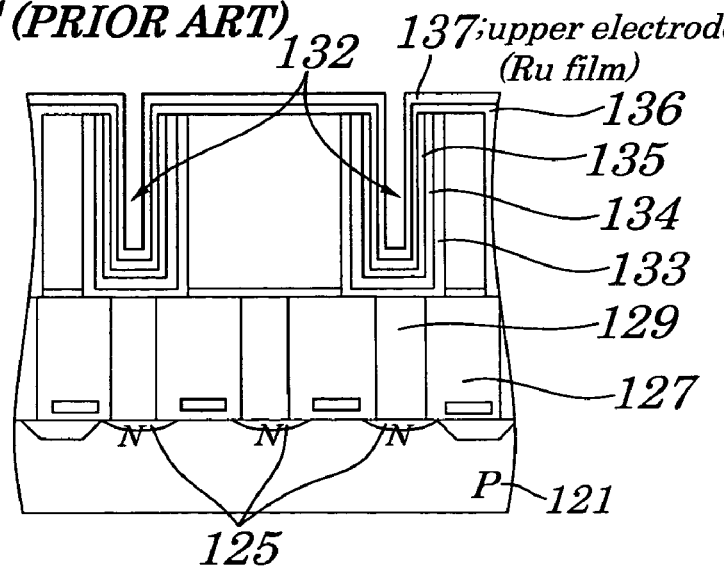
Figure 12:
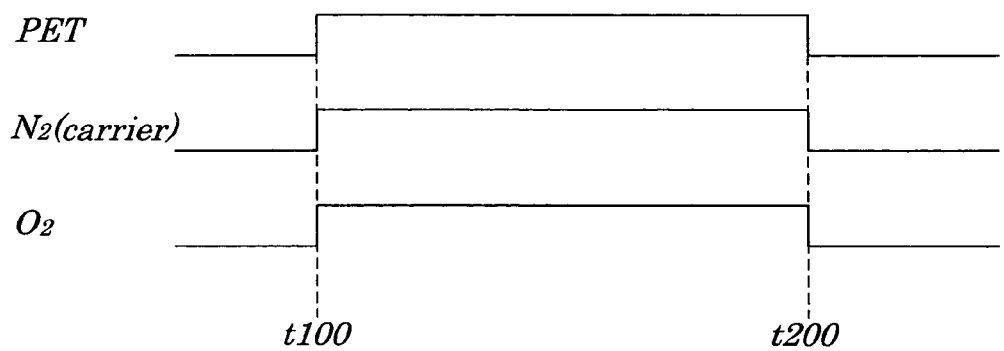
FIG. 12 is a diagram for showing a film formation sequence for forming a tantalum oxide film in the conventional semiconductor device manufacturing method.
Figure 13:
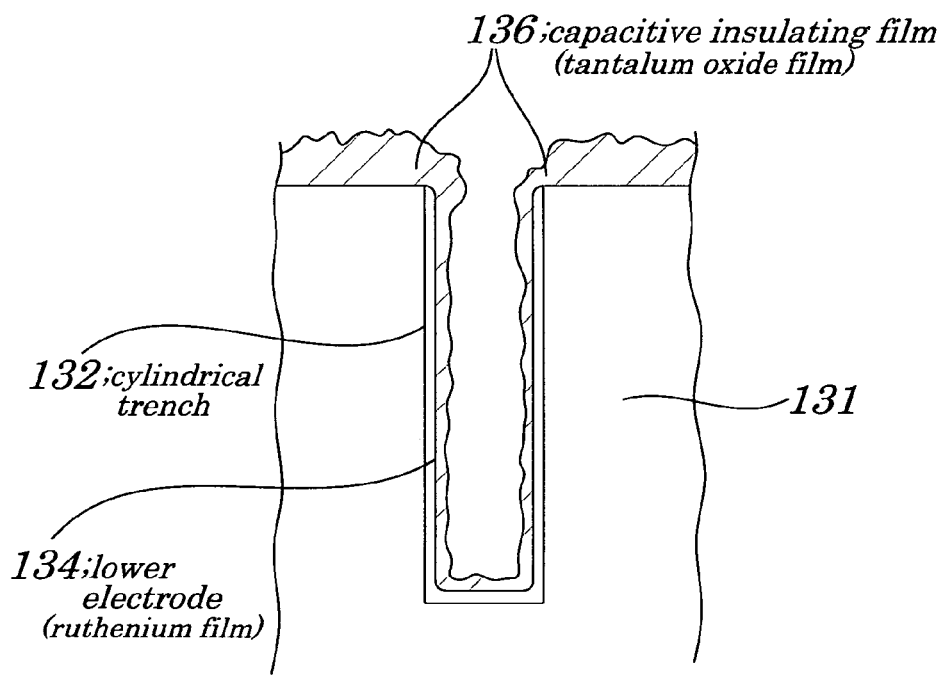
FIG. 13 is an illustration for schematically showing a tantalum oxide film formed in the conventional semiconductor device manufacturing method.

By the semiconductor device manufacturing method according to the seventh embodiment, when repeating 60 times one step ST including a first stage S1 for introducing a material gas for film formation as in the case of the first embodiment and a second stage S2 for removing a byproduct produced at the first stage S1, the second stage S2 in each of the steps is performed through a process for introducing an oxygen gas and a process for introducing a nitrogen gas, thereby forming a tantalum oxide film having a finally required film thickness (15 nm). That is, as is clear from a film formation sequence of FIG. 11, a substrate 1 is placed in a reaction chamber heated to about 430° C. and kept at about 4 Torr and then, at a time t1, a material gas obtained by atomizing and vaporizing PET using a nitrogen carrier gas with a flow rate of 500 sccm to vaporize it is introduced into the reaction chamber at a rate of 50 mg/m to thus start forming the tantalum oxide film and then, at a time t2 after a lapse of five seconds, introduction of the material gas is stopped. During this lapse of time of five seconds, a 0.25-nm thick tantalum oxide film is formed. Next, during a lapse of time of five seconds from the time t2 to a time t3, an oxygen gas is introduced at a flow rate of 500 scc and then, during a lapse of time of five seconds from the time t3 to a time t4, a nitrogen gas is introduced at a flow rate of 1000 sccm, thereby ending the first-time step ST.

Subsequently, by similarly performing the second-time to sixtieth-time steps ST, a capacitive insulating film 14 made up of a tantalum oxide film having the finally required film thickness of 15 nm is formed on a lower electrode 13.

In the seventh embodiment, an oxygen gas is introduced not together with a material gas but after introduction of the material gas is stopped, so that a byproduct is produced less than in the case of the fourth to sixth embodiments where the oxygen gas is introduced at the same time as the introduction of the material gas. Therefore, time can be reduced that is required to remove the byproduct at the second stage. Further, a thin metal oxide film formed at the first stage is exposed to an oxygen gas immediately after being formed, so that it is possible to fill in oxygen vacancies and remove organic matter, thereby improving a film quality. Further, in this case, the oxygen gas plays a role of purging the byproduct besides a role of improving the metal oxide film quality.

Subsequently, as in the case of the first embodiment, after annealing processing or a like are performed, roughly the same step as that of FIG. 1G is repeated, to form an upper electrode 15 made of, for example, ruthenium on the capacitive insulating film 14, thereby completing a memory cell 17 having a capacitor 16 formed thereon.

As described above the first embodiment, by the semiconductor device manufacturing method of the seventh embodiment, since there is no byproduct in the reaction chamber when introduction of a material gas is started, the material gas prevails throughout the surface including an inside of a cylindrical trench 12, so that a 0.25-nm thick tantalum oxide film to be formed at the first stage S1 in the first-time step ST grows uniformly. Further, since a byproduct is already removed by a nitrogen gas acting as a purge gas and an oxygen gas acting also as a purge gas at the second stage S2 in the previous step ST when the material gas is introduced at the first stage S1, the material gas prevails throughout the surface including the inside of the cylindrical trench 12, so that a 0.25-nm thick tantalum oxide film to be formed at the first stage S1 in each of the second-time to sixtieth-time steps ST can grow uniformly, thereby improving step coverage of the capacitive insulating film 14.

Further, by the semiconductor device manufacturing method of the seventh embodiment, introduction of an oxygen gas is delayed in starting after introduction of a material gas is stopped, so that it is possible to delay production of a byproduct involved in earlier introduction of the oxygen gas, thereby preventing the byproduct from being produced excessively. It is thus possible to improve a film quality of the capacitive insulating film without deteriorating its step coverage.

Figure 10:
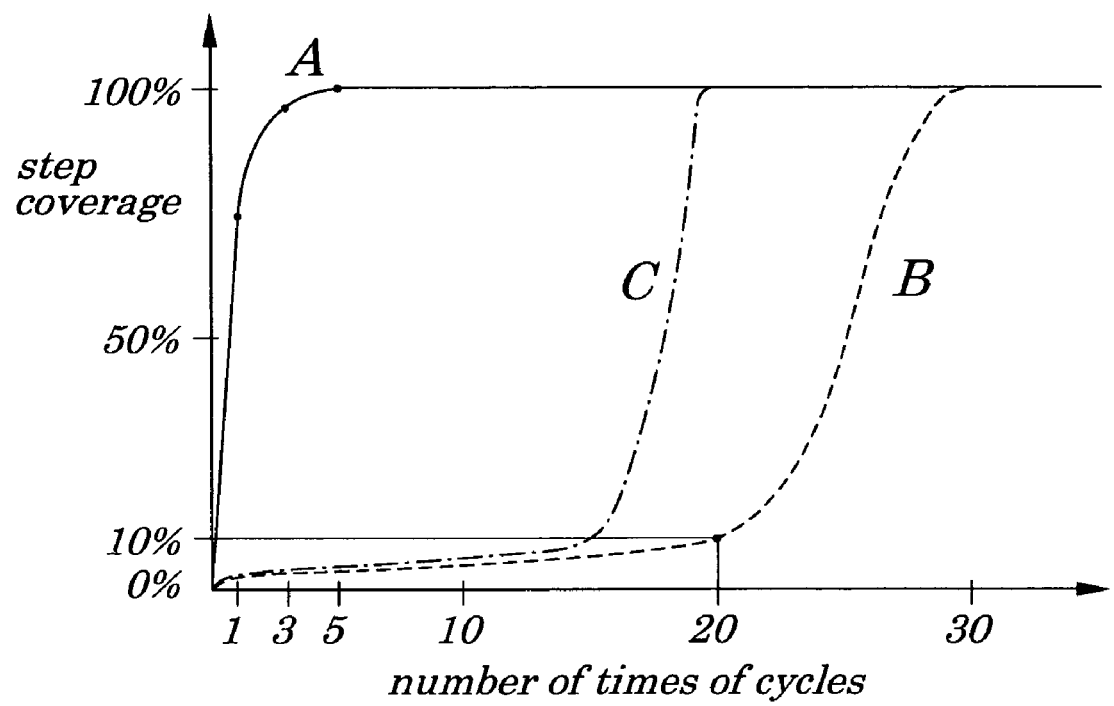
FIG. 10 is a graph for schematically showing a relationship between the number of times of cycles (number of times of repetitions) (horizontal axis) and step coverage (vertical axis) in a case where a tantalum oxide film is formed by repeating a step ST a plurality of number of times according to the present invention.

In FIG. 10, a characteristic A corresponds to the second embodiment, a characteristic B corresponds to the third embodiment, and a characteristic C corresponds to the fifth embodiment. As is clear from FIG. 10, step coverage can be improved in an ascending order of the number of repetitions, as indicated by the characteristics A, B, and C sequentially, so that the embodiments can be selected optimally in accordance with purposes, applications, or a like.

It is apparent that the present invention is not limited to the above embodiments but may be changed and modified without departing from the scope and spirit of the invention.

For example, although the embodiments have been described in an example where a tantalum oxide film is formed by means Of CVD, the present invention can be applied also to a case where such physical means as Physical vapor Deposition (PVD) is employed. Further, of two tantalum oxide film formation methods of a sheet-feed method for processing a plurality of semiconductor substrates one by one and a batch method for processing them simultaneously, the present invention can be applied especially to the sheet-feed method to obtain remarkable effects of suppressing abnormal growth, which occurs readily by the sheet-feed method, because by this method a reactive gas is typically supplied, during film formation, to the semiconductor substrates mounted in a film formation apparatus from a near position. Further, an amount of PET, a flow rate of a nitrogen gas, a flow rate of an oxygen gas, or a like employed in formation of the tantalum oxide film are not limited to those employed in the embodiment but may be altered arbitrarily as necessary.

Further, as metal constituting a metal oxide film having a large dielectric constant, not only tantalum but also other metal such as hafnium (Hf), zirconium (Zr), or niobium (Nb) may be used. In a case where hafnium is used, hafnium tertiary butoxide [$Hf(OC_4H_9)_4$], tetrakis 1-methoxy 2-methyl 2-propoxy hafnium [$Hf(MMP)_4$], or a like can be used as a source and, in a case where zirconium is used, zirconium tertiary butoxide [$Zr(OC_4H_9)_4$], tetrakis 1-methoxy 2-methyl 2-propoxy zirconium [$Zr(MMP)_4$], or a like can be used as the source. Further, as the metal oxide film constituting a capacitive insulating film, not only the above-mentioned simple-substance oxide film made of metal but also a metal oxide film formed by mixing a plurality of kinds of metal such as, for example, tantalum and niobium may be used.

Further, as metal having a catalytic action used as a material of a lower electrode, not only ruthenium (Ru) but also other metal such as platinum (Pt) maybe used. Further, as a purge gas, not only a nitrogen gas used in the embodiments but also any other inactive gases such as argon (Ar) or helium (He), an oxygen gas, or a like may be used. Further, an oxygen gas, if employed, may be used not only alone but also as containing, for example, ozone ($O_3$), water ($H_2O$), nitrogen oxide ($N_2O$, $NO_x$), or oxygen radical.

Although the embodiments have been described in a case where a finally required film thickness is selected to 15 nm, the film thickness is not limited to it but may be altered appropriately. It is to be noted that to alter the finally required film thickness, it is possible to appropriately alter a thickness of a film to be formed in one step ST or the number of times of repeating the step, according to a required film quality or throughput. For example, although the embodiments have been described in a case where to provide the finally required film thickness of 15 nm the thickness of the film to be formed in one step ST is selected to 0.25 nm, the film thickness may be selected to a value larger than 0.25 nm as far as a byproduct is not produced or, if produced, is influential little. Further, although the first, second, and third embodiments have been described in cases where the number of times of repetitions is selected to 60, 10, and 20 respectively, the number can be altered appropriately.

Further, as a gate insulating film of a transistor constituting a DRAM, a nitride film or a double structure comprised of an oxide film and a nitride film may be employed. That is, as far as being a Metal Insulator Semiconductor (MIS)

transistor, not only an MOS transistor but also a Metal Nitride Semiconductor (MNS) transistor or a Metal Nitride Oxide Semiconductor (MNOS) transistor may be employed. Further, a cross section of a lower electrode constituting a capacitor may be selected arbitrarily, for example, circular or ellipsoidal and also the number of cylindrical trenches may be selected arbitrarily.

What is claimed is:

1. A method for manufacturing a semiconductor device, comprising a dual-stage deposition step comprising:
a first stage for introducing a material gas containing an oxide of a desired metal into a reaction chamber in which a semiconductor substrate on a surface of which a metal film is formed in part or in entirety is placed to thus form an oxide film made of said desired metal by a vapor-phase growth method and, after completion of the first stage, a following second stage for removing from said reaction chamber said material gas introduced into said reaction chamber at said first stage and a byproduct produced at said first stage,
wherein said semiconductor substrate has a cylindrical trench on a surface thereof,
wherein said metal oxide film as an oxide of said specified metal is formed on said semiconductor substrate including regions on a bottom and an inner side wall of said cylindrical trench, by repeating said dual-stage deposition step two or more times, and
wherein when said metal oxide film is completely formed, said semiconductor substrate is annealed.

2. The method according to claim 1, wherein said material gas and said byproduct produced at said first stage are removed by introducing a gas different from said material gas at said first stage into said reaction chamber at said second stage.

3. The method according to claim 1, wherein said material gas and said byproduct produced at said first stage are removed by depressurizing said reaction chamber at said second stage.

4. The method according to claim 1, wherein said metal oxide film having a finally required film thickness is formed by repeating said steps a plurality of number of times.

5. The method according to claim 1, wherein after said steps are repeated a plurality of number of times, said material gas is introduced continuously for a time longer than that required for said first stage, to form said metal oxide film having the finally required film thickness.

6. The method according to claim 1, wherein an oxidizing gas is introduced at said first stage.

7. The method according to claim 1, wherein said second stage comprises a process for introducing an oxidizing gas and a process for introducing said material gas and a gas different from said oxidizing gas.

8. The method according to claim 1, wherein said metal film is made of metal having a catalytic action.

9. The method according to claim 1, wherein said vapor-phase growth method is a chemical vapor deposition method or a physical vapor deposition method.

10. The method according to claim 1, wherein said metal oxide film as said oxide of said specified metal is made of at least one selected from the group consisting essentially of tantalum, hafnium, zirconium, and niobium.

11. The method according to claim 2, wherein said gas different from said material gas is an inactive gas.

12. The method according to claim 3, wherein after having performed said depressurizing at said second stage and before said first stages starts in a next dual-stage deposition step, a gas different from said material gas is introduced into said reaction chamber to thus recover a gas pressure before performing said depressurizing in said reaction chamber.

13. The method according to claim 6, wherein introduction of said oxidizing gas is started from a second-time said steps.

14. The method according to claim 6, wherein as said oxidizing gas, a gas containing oxygen, ozone, water, nitrogen oxide, or oxygen radical is used.

15. The method according to claim 8, wherein as said metal having a catalytic action, ruthenium or platinum is used.

16. The method according to claim 10, wherein tantalum penta-ethoxide is used as said material gas.

17. The method according to claim 11, wherein said inactive gas is a nitrogen gas.

18. A method for manufacturing a semiconductor device having a capacitor, comprising:
a dual-stage deposition step comprising:
a first stage for introducing a material gas containing an oxide of a desired metal into a reaction chamber in which a semiconductor substrate on a surface of which a metal film is formed in part or in entirety is placed to thus form an oxide film made of said desired metal by a vapor-phase growth method and,
after completion of the first stage, the following second stage for removing from said reaction chamber said material gas introduced into said reaction chamber at said first stage and a byproduct produced at said first stage,
wherein said semiconductor substrate has a cylindrical trench on a surface thereof,
wherein said metal oxide film as an oxide of said specified metal is formed on said semiconductor substrate including regions on a bottom and an inner side wall of said cylindrical trench, by repeating said dual-stage deposition step two or more times, thereby forming a capacitive insulating film to make up said capacitor;
annealing said semiconductor substrate when said capacitive insulating film is completely formed; and
forming an upper electrode to make up said capacitor on said capacitive insulating film.

19. The method according to claim 18, wherein said material gas and said byproduct produced at said first stage are removed by introducing a gas different from said material gas at said first stage into said reaction chamber at said second stage.

20. The method according to claim 18, wherein said material gas and said byproduct produced at said first stage are removed by depressurizing said reaction chamber at said second stage.

21. The method according to claim 18, wherein said metal oxide film having a finally required film thickness is formed by repeating said steps a plurality of number of times.

22. The method according to claim 18, wherein after said steps are repeated a plurality of number of times, said material gas is introduced continuously for a time longer than that required for said first stage, to form said metal oxide film having the finally required film thickness.

23. The method according to claim 18, wherein an oxidizing gas is introduced at said first stage.

24. The method according to claim 18, wherein said second stage comprises a process for introducing an oxidizing gas and a process for introducing said material gas and a gas different from said oxidizing gas.

25. The method according to claim 18, wherein said metal film is made of metal having a catalytic action.

26. The method according to claim 18, wherein said vapor-phase growth method is a chemical vapor deposition method or a physical vapor deposition method.

27. The method according to claim 18, wherein said metal oxide film as said oxide of said specified metal is made of at least one selected from the group consisting essentially of tantalum, hafnium, zirconium, and niobium.

28. The method according to claim 19, wherein said gas different from said material gas is an inactive gas.

29. The method according to claim 20, wherein after having performed said depressurizing at said second stage and before said first stages starts in a next dual-stage deposition step, a gas different from said material gas is introduced into said reaction chamber to thus recover a gas pressure before performing said depressurizing in said reaction chamber.

30. The method according to claim 23, wherein introduction of said oxidizing gas is started from a second-time said steps.

31. The method according to claim 23, wherein as said oxidizing gas, a gas containing oxygen, ozone, water, nitrogen oxide, or oxygen radical is used.

32. The method according to claim 25, wherein as said metal having a catalytic action, ruthenium or platinum is used.

33. The method according to claim 27, wherein tantalum penta-ethoxide is used as said material gas.

34. The method according to claim 28, wherein said inactive gas is a nitrogen gas.

* * * * *